United States Patent
Li

(10) Patent No.: US 10,490,561 B2
(45) Date of Patent: Nov. 26, 2019

(54) STATIC RANDOM-ACCESS MEMORY (SRAM) AND MANUFACTURE THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 15/981,505

(22) Filed: May 16, 2018

(65) Prior Publication Data

US 2018/0337190 A1    Nov. 22, 2018

(30) Foreign Application Priority Data

May 19, 2017   (CN) .......................... 2017 1 0355742

(51) Int. Cl.
*H01L 29/06* (2006.01)
*H01L 27/11* (2006.01)
(Continued)

(52) U.S. Cl.
CPC .. *H01L 27/1108* (2013.01); *H01L 21/823828* (2013.01); *H01L 21/823842* (2013.01);
(Continued)

(58) Field of Classification Search
CPC ..... H01L 27/11; H01L 21/8238; H01L 29/06; H01L 29/423; H01L 27/1108;
(Continued)

(56) References Cited

U.S. PATENT DOCUMENTS

2014/0203335 A1* 7/2014 Song ........................ H01L 29/78
257/288
2016/0276482 A1* 9/2016 Kim .................... H01L 27/0207

* cited by examiner

*Primary Examiner* — Tucker J Wright
*Assistant Examiner* — Dmitriy Yemelyanov
(74) *Attorney, Agent, or Firm* — Innovation Counsel LLP

(57) ABSTRACT

A Static Random-Access Memory (SRAM) device and its manufacturing method are presented, relating to semiconductor techniques. The SRAM device includes: a substrate; a first semiconductor column for Pull-Up (PU) transistors and a second semiconductor column for Pull-Down (PD) transistors, with both the first and the second semiconductor columns on the substrate; a first separation region, and a gate stack structure. The first separation region is between the first and the second semiconductor columns and comprises a first region and a second region, the gate stack structure comprises a gate dielectric layer comprising a first part and a second part; a P-type work function regulation layer comprising a first area and a second area adjacent to each other; a N-type work function regulation layer comprising a third area and a fourth area adjacent to each other; and a gate on both the P-type and N-type work function regulation layers.

9 Claims, 9 Drawing Sheets

(51) Int. Cl.
*H01L 21/8238* (2006.01)
*H01L 29/423* (2006.01)
*H01L 29/786* (2006.01)

(52) U.S. Cl.
CPC .. *H01L 21/823885* (2013.01); *H01L 27/1104* (2013.01); *H01L 29/0669* (2013.01); *H01L 29/42392* (2013.01); *H01L 29/78642* (2013.01)

(58) Field of Classification Search
CPC ..... H01L 21/823828; H01L 21/823842; H01L 21/823885; H01L 27/1104; H01L 29/0669; H01L 29/42392; H01L 29/78642
See application file for complete search history.

STATIC RANDOM-ACCESS MEMORY (SRAM) AND MANUFACTURE THEREOF

CROSS-REFERENCE TO RELATED APPLICATION

This application claims priority to and benefit of Chinese Patent Application No. 201710355742.X filed on May 19, 2017, which is incorporated herein by reference in its entirety.

BACKGROUND

(a) Field of the Invention

This inventive concept relates generally to semiconductor techniques, more specifically, to a Static Random-Access Memory (SRAM) and its manufacturing method, and particularly, to a vertical Gate-All-Around (GAA) nanowire SRAM and its manufacturing method.

(b) Description of the Related Art

SRAM has been widely used in communication equipment and consumer electronic devices for its exceptional characteristics including its high speed and low power consumption.

A SRAM typically comprises Pull-Up (PU) transistors, Pull-Down (PD) transistors, and Pass-Gate (PG) transistors. Mismatch could happen among the PU transistors or the PD transistors in a SRAM and results in lowered yield, therefore it is desirable to keep mismatch in a SRAM as low as possible.

On the boundary between PU transistors and PD transistors in a vertical Gate-All-Around (GAA) nanowire SRAM, a metallic element in a P-type work function regulation layer (for adjusting gate structures in the PU transistors) may diffuse into a N-type work function regulation layer (for adjusting gate structures in the PD transistors). On the other hand, a metallic element in the N-type work function regulation layer may also diffuse into the P-type work function regulation layer. The metal diffusion adversarially affects the performance of the PU/PD transistors and results in mismatch among the PU/PD transistors.

SUMMARY

Based on the investigation to the issues in conventional SRAMs, this inventive concept presents an innovative solution that remedies at least some of the limitations.

This inventive concept first presents a SRAM device, comprising:
a substrate;
a first semiconductor column for Pull-Up (PU) transistors and a second semiconductor column for Pull-Down (PD) transistors, with both the first and the second semiconductor columns on the substrate;
a first separation region on the substrate between the first and the second semiconductor columns, comprising:
  a first region adjacent to both the first and the second semiconductor columns; and
  a second region on the first region and separated from the first and the second semiconductor columns; and
a gate stack structure exposing an upper portion of the first semiconductor column and an upper portion of the second semiconductor column, comprising:

a gate dielectric layer comprising a first part and a second part, with the first part on a portion of a side surface of the first semiconductor column and the second part on a portion of a side surface of the second semiconductor column;
a P-type work function regulation layer comprising a first area and a second area adjacent to each other, with the first area on the first part of the gate dielectric layer, and the second area on a first portion of the first separation region;
a N-type work function regulation layer comprising a third area and a fourth area adjacent to each other, with the third area on the second part of the gate dielectric layer, and the fourth area on a second portion of the first separation region; and
a gate on both the P-type and N-type work function regulation layers.

Additionally, in the aforementioned SRAM device, the second area and the fourth area may be adjacent to each other.

Additionally, in the aforementioned SRAM device, the first region may comprise a first sub-region and a second sub-region, with the first sub-region located between the first semiconductor column and the second region, and the second sub-region located between the second semiconductor column and the second region,
and the second area may adjoin the fourth area on an upper surface of the second region, on an upper surface of the first sub-region or on an upper surface of the second sub-region.

Additionally, in the aforementioned SRAM device, the gate dielectric layer may further comprise a third part on the first separation region adjacent to both the first part and the second part, with both the second area and the fourth area on the third part of the gate dielectric layer.

Additionally, in the aforementioned SRAM device, the N-type work function regulation layer may further comprise a fifth area on the P-type work function regulation layer.

Additionally, the aforementioned SRAM device may further comprise:
an inter-layer dielectric layer on the gate stack structure covering an upper portion of the first semiconductor column and an upper portion of the second semiconductor column;
a first contact component extending from an upper surface of the inter-layer dielectric layer to the upper surface of the first semiconductor column;
a second contact component extending from the upper surface of the inter-layer dielectric layer to the upper surface of the second semiconductor column;
a third contact component extending from the upper surface of the inter-layer dielectric layer to the gate; and
a fourth contact component extending from the upper surface of the inter-layer dielectric layer to the substrate.

Additionally, the aforementioned SRAM device may further comprise:
a second separation region between the gate stack structure and the inter-layer dielectric layer, with an upper surface of the second separation region lower than the upper surfaces of the first semiconductor column and the second semiconductor column.

Additionally, in the aforementioned SRAM device, the first semiconductor column and the second semiconductor column may comprise nanowires.

Additionally, in the aforementioned SRAM device, the gate dielectric layer may comprise a high-K dielectric material.

This inventive concept further presents a SRAM manufacturing method, comprising:
providing a substrate structure, comprising:
a substrate;
a first semiconductor column for Pull-Up (PU) transistors and a second semiconductor column for Pull-Down (PD) transistors, with the first semiconductor column and the second semiconductor column on the substrate and separated by a space; and
a first separation material layer on the substrate at least partially filling the space between the first semiconductor column and the second semiconductor column;
conducting an etch-back process on the first separation material layer to form a first separation region, wherein the first separation region comprises a first region and a second region, with the first region adjacent to both the first semiconductor column and the second semiconductor column, the second region on the first region and separated from the first semiconductor column and the second semiconductor column; and
forming a gate stack structure, wherein the gate stack structure comprises:
a gate dielectric layer comprising a first part and a second part, wherein the first part is on a portion of a side surface of the first semiconductor column and the second part is on a portion of a side surface of the second semiconductor column, and the gate dielectric layer exposes an upper portion of the first semiconductor column and an upper portion of the second semiconductor column;
a P-type work function regulation layer comprising a first area and a second area adjacent to each other, with the first area on the first part of the gate dielectric layer, and the second area on a first portion of the first separation region;
a N-type work function regulation layer comprising a third area and a fourth area adjacent to each other, with the third area on the second part of the gate dielectric layer, and the fourth area on a second portion of the first separation region; and
a gate on the P-type work function regulation layer and the N-type work function regulation layer.

Additionally, in the aforementioned method, the second area and the fourth area may be adjacent to each other.

Additionally, in the aforementioned method, the first region of the first separation region may comprise a first sub-region and a second sub-region, with the first sub-region located between the first semiconductor column and the second region of the first separation region, and the second sub-region located between the second semiconductor column and the second region of the first separation region, and the second area may adjoin the fourth area on an upper surface of the second region, on an upper surface of the first sub-region, or on an upper surface of the second sub-region.

Additionally, in the aforementioned method, the gate dielectric layer may further comprise a third part on the first separation region adjacent to the first part and the second part, with both the second area and the fourth area on the third part.

Additionally, in the aforementioned method, forming a gate stack structure may comprise:
forming a gate dielectric material layer covering the first separation region, a portion of the first semiconductor column above the first separation region, and a portion of the second semiconductor column above the first separation region;
forming a P-type work function regulation material layer and a N-type work function regulation material layer, wherein the P-type work function regulation material layer is on the first semiconductor column and a portion of the gate dielectric material layer on a first portion of the first separation region, and the N-type work function regulation material layer is on the second semiconductor column and a portion of the gate dielectric material layer on a second portion of the first separation region;
forming a gate material layer on the P-type work function regulation material layer and the N-type work function regulation material layer;
conducting an etch-back process on the gate material layer to expose the gate dielectric material layer and the P-type work function regulation material layer on an upper portion of the first semiconductor column, and to expose the gate dielectric material layer and the N-type work function regulation material layer on an upper portion of the second semiconductor column;
removing the gate dielectric material layer and the P-type work function regulation material layer on the upper portion of the first semiconductor column to expose the upper portion of the first semiconductor column; and
removing the gate dielectric material layer and the N-type work function regulation material layer on the upper portion of the second semiconductor column to expose the upper portion of the second semiconductor column,
wherein the remaining gate dielectric material layer becomes the gate dielectric layer, the remaining P-type work function regulation material layer becomes the P-type work function regulation layer, the remaining N-type work function regulation material layer becomes the N-type work function regulation layer, and the remaining gate material layer becomes the gate.

Additionally, in the aforementioned method, the N-type work function regulation layer may further comprise a fifth area on the P-type work function regulation layer.

Additionally, in the aforementioned method, providing a substrate structure may comprise:
providing an initial substrate structure, comprising:
a substrate;
a first semiconductor column and a second semiconductor column on the substrate and separated from each other;
a hard mask layer on the first semiconductor column and the second semiconductor column; and
a first initial separation material layer filling a space between the first semiconductor column and the second semiconductor column, with an upper surface of the first initial separation material layer substantially level with an upper surface of the hard mask layer;
conducting an etch-back process on the first initial separation material layer so that an upper surface of the remaining first initial separation material layer is lower than upper surfaces of the first semiconductor column and the second semiconductor column; and
removing the hard mask layer to form the substrate structure.

Additionally, the aforementioned method may further comprise:
forming an inter-layer dielectric layer on the gate stack structure covering upper portions of the first semiconductor column and the second semiconductor column; and
forming a first contact component extending from an upper surface of the inter-layer dielectric layer to the upper surface of the first semiconductor column;

forming a second contact component extending from the upper surface of the inter-layer dielectric layer to the upper surface of the second semiconductor column;

forming a third contact component extending from the upper surface of the inter-layer dielectric layer to the gate; and forming a fourth contact component extending from the upper surface of the inter-layer dielectric layer to the substrate.

Additionally, the aforementioned method may further comprise:

before forming the inter-layer dielectric layer, forming a second separation region on the gate stack structure, with an upper surface of the second separation region lower than the upper surfaces of the first semiconductor column and the second semiconductor column.

Additionally, in the aforementioned method, the first semiconductor column and the second semiconductor column may comprise nanowires.

Additionally, in the aforementioned method, the gate dielectric layer may comprise a high-K dielectric material.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1:
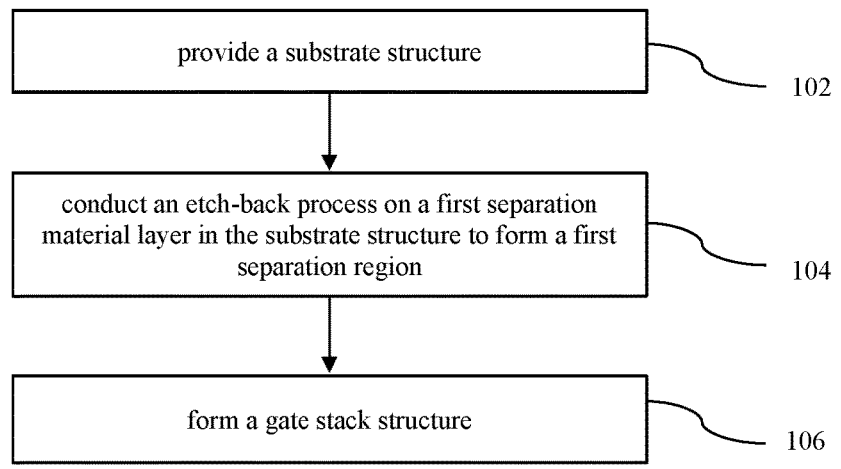
FIG. 1 shows a simplified flowchart illustrating a SRAM device manufacturing method in accordance with one embodiment of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements. An "SRAM device," as used herein, is any device including an SRAM.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a simplified flowchart illustrating a SRAM device manufacturing method in accordance with one embodiment of this inventive concept. FIGS. 2, 3, 4, 5A, 5B, 5C, 6A, 6B, 6C, 7A, 7B, and 7C show cross-sectional views illustrating different stages of a SRAM device manufacturing method in accordance with one embodiment of this inventive concept. This SRAM device manufacturing method is described below with reference to these drawings.

First, referring to FIG. 1, in step 102, a substrate structure is provided.

Figure 2:
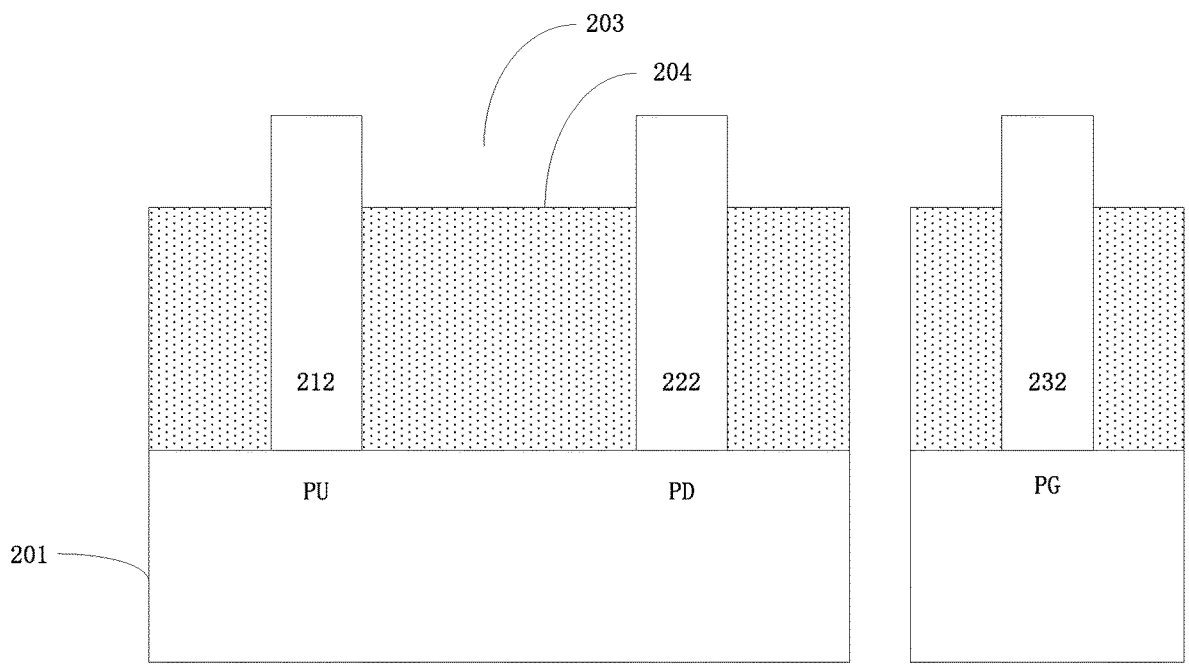
FIGS. 2, 3, 4, 5A, 5B, 5C, 6A, 6B, 6C, 7A, 7B, and 7C show cross-sectional views illustrating different stages of a SRAM device manufacturing method in accordance with one embodiment of this inventive concept.

FIG. 2 shows a cross-sectional view illustrating a substrate structure of an SRAM device in accordance with one embodiment of this inventive concept. In FIG. 2, the substrate structure comprises a substrate 201, a first semiconductor column 212 for PU transistors and a second semiconductor column 222 for PD transistors, with both the first semiconductor column 212 and the second semiconductor column 222 on the substrate 201 and substantially perpendicular to an upper surface of the substrate 201. The first semiconductor column 212 and the second semiconductor column 222 are separated by a space 203.

For example, the substrate 201 may be an elemental semiconductor substrate such as a silicon substrate or a germanium substrate, the substrate 201 may also be a compound semiconductor substrate such as a gallium arsenide substrate. The first semiconductor column 212 and the second semiconductor column 222 may be made of materials including, but not limited to, silicon, germanium, or silicon germanium (SiGe) compound. In one embodiment, the first semiconductor column 212 and the second semiconductor column 222 may comprise nanowires.

The substrate structure may further comprise a first separation material layer 204 on the substrate 201 at least partially filling the space 203. The first separation material layer 204 may be a silicon oxide layer.

Here, the first separation material layer 204 may partially fill the space 203, that is, an upper surface of the first separation material layer 204 may be lower than upper surfaces of the first semiconductor column 212 and the second semiconductor column 222. Alternatively, the first separation material layer 204 may completely fill the space 203, that is, the upper surface of the first separation material layer 204 may be substantially level with the upper surfaces of the first semiconductor column 212 and the second semiconductor column 222.

In this disclosure, a surface is considered to be "substantially" perpendicular (or level) with another surface when these two surfaces are perpendicular (or level) with each other within a normal process deviation. Additionally, the first separation material layer 204 may not only fill the space 203, but also encompass the first semiconductor column 212 and the second semiconductor column 222. The substrate structure may further comprise a third semiconductor column 232 for PG transistors, and the third semiconductor column 232 may also be encompassed by the first separation material layer 204.

A detail embodiment to form the substrate structure of FIG. 2 is described below.

First, in step S1, an initial substrate structure is provided, the initial substrate structure may comprise a substrate 201, a first semiconductor column 212 and a second semiconductor column 222 on the substrate 201, a hard mask layer (e.g., a silicon nitride layer) on the first semiconductor column 212 and the second semiconductor column 222, and a first initial separation material layer 204 on the substrate 201 filling a space 203 between the first semiconductor column 212 and the second semiconductor column 222. An upper surface of the first initial separation material layer 204 is substantially level with an upper surface of the hard mask layer.

Next, in step S2, an etch-back process is conducted on the first initial separation material layer 204 so that an upper surface of the remaining first initial separation material layer 204 is lower than the upper surfaces of the first semiconductor column 212 and the second semiconductor column 222.

Next, in step S3, the hard mask layer on the first semiconductor column 212 and the second semiconductor column 222 is removed to form the substrate structure of FIG. 2.

In another embodiment, step S3 may be conducted before step S2.

Figure 3:
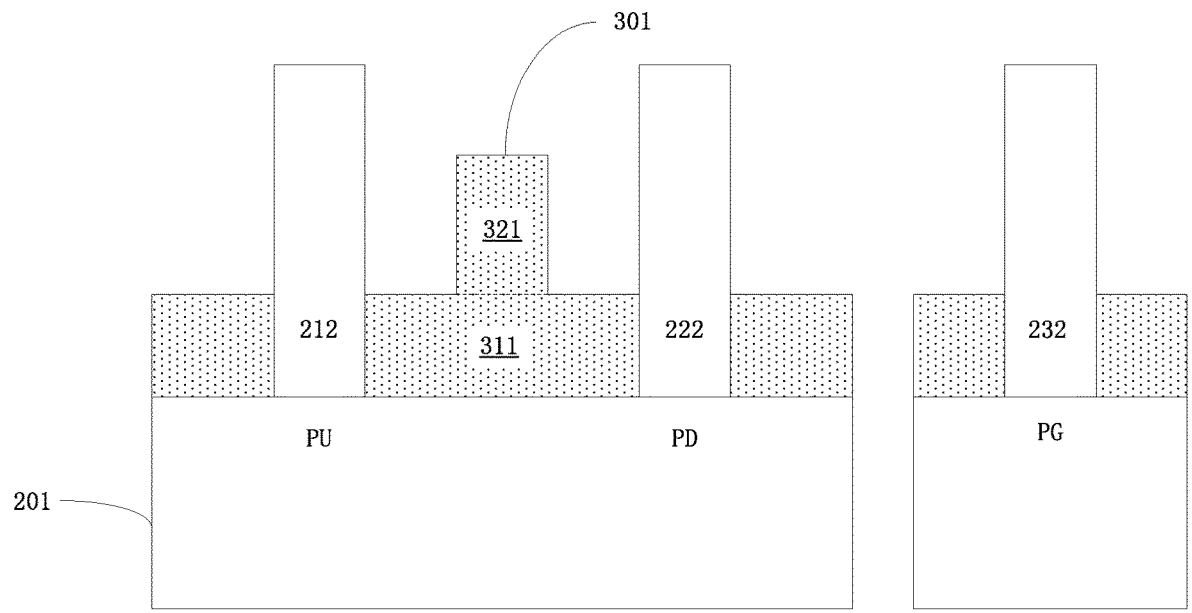

Referring to FIG. 1, in step 104, an etch-back process is conducted on the first separation material layer 204 to form a first separation region 301, as shown in FIG. 3. The first separation region 301 may comprise a first region 311 adjacent to the first semiconductor column 212 and the second semiconductor column 222, and a second region 321 on the first region 311 separated from the first semiconductor column 212 and the second semiconductor column 222. In a top plan view, the second region 321 may have the same shape with the first semiconductor column 212 and the second semiconductor column 222. For example, the second region 321 may have a circular or a square shape in a top plan view.

Next, in step 106, a gate stack structure is formed.

A detail embodiment to form the gate stack structure is described below with reference to FIGS. 4, 5A, 5B, 5C, 6A, 6B, 6C, 7A, 7B, and 7C.

Figure 4:
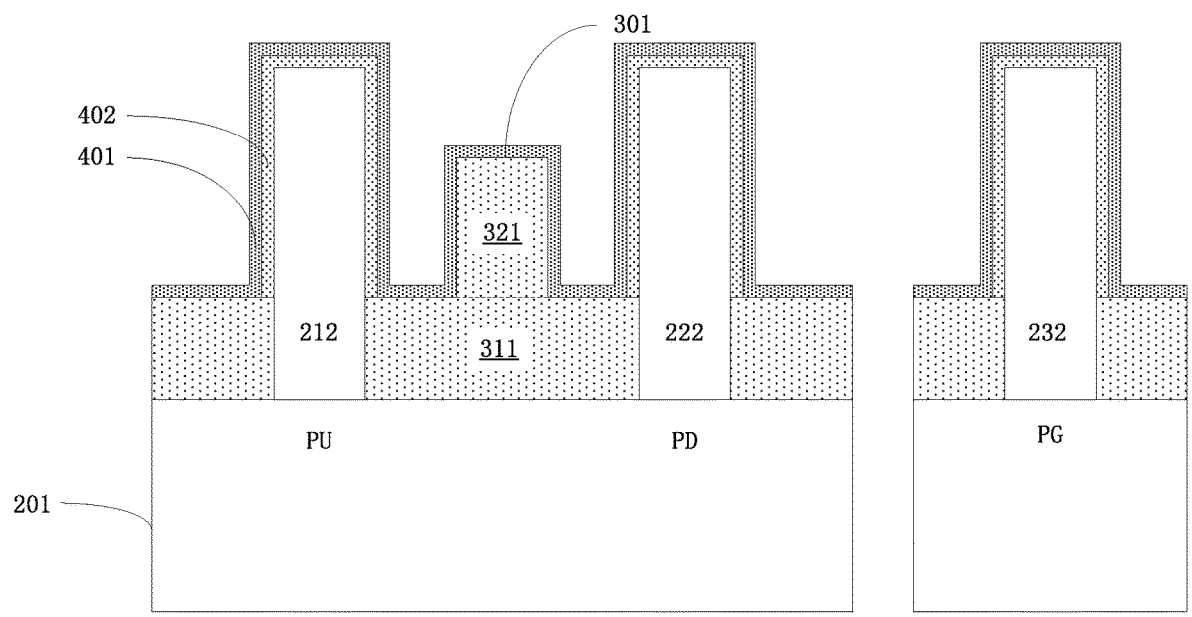

First, referring to FIG. 4, a gate dielectric material layer 401 is formed on the first separation layer 301, on a portion of the first semiconductor column 212 above the first separation region 301, and on a portion of the second semiconductor column 222 above the first separation region 301. The first separation layer 301 may be made of a high-K dielectric material such as aluminium oxide ($Al_2O_3$) or hafnium dioxide ($HfO_2$). Before the first separation material layer 401 is formed, an interface material layer 402 (e.g., a silicon oxide layer) may be formed on the portion of the first semiconductor column 212 above the first separation region 301 and on the portion of the second semiconductor column 222 above the first separation region 301.

Figure 5A:
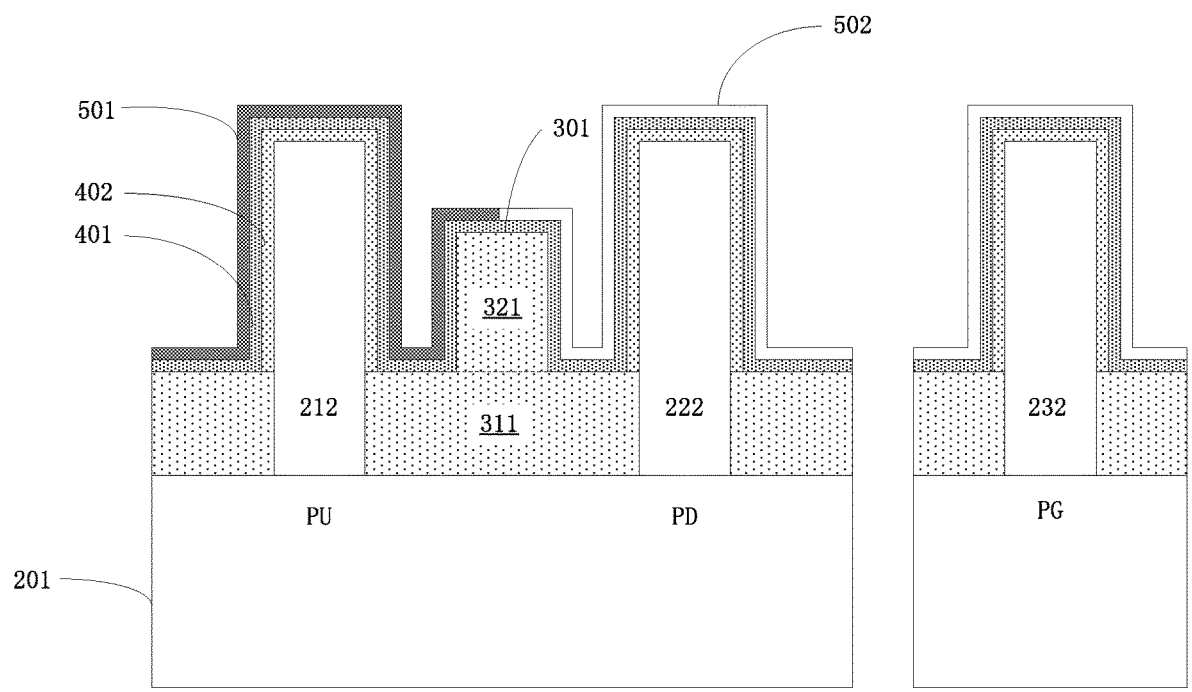
Figure 5B:
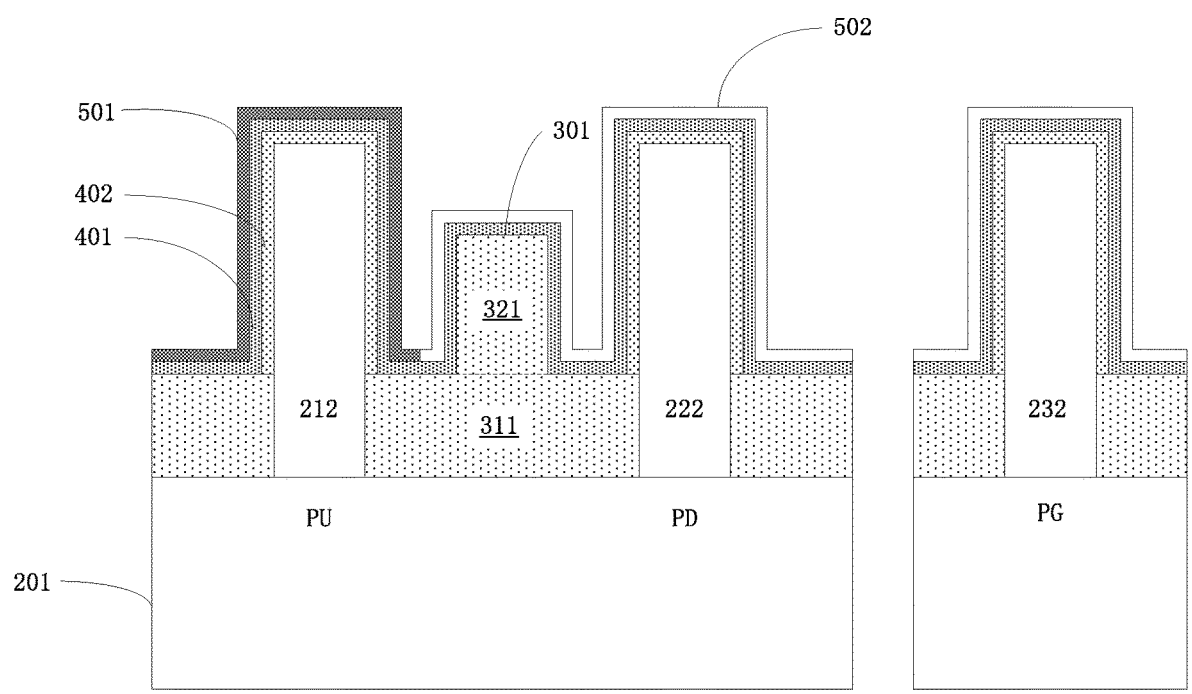
Figure 5C:
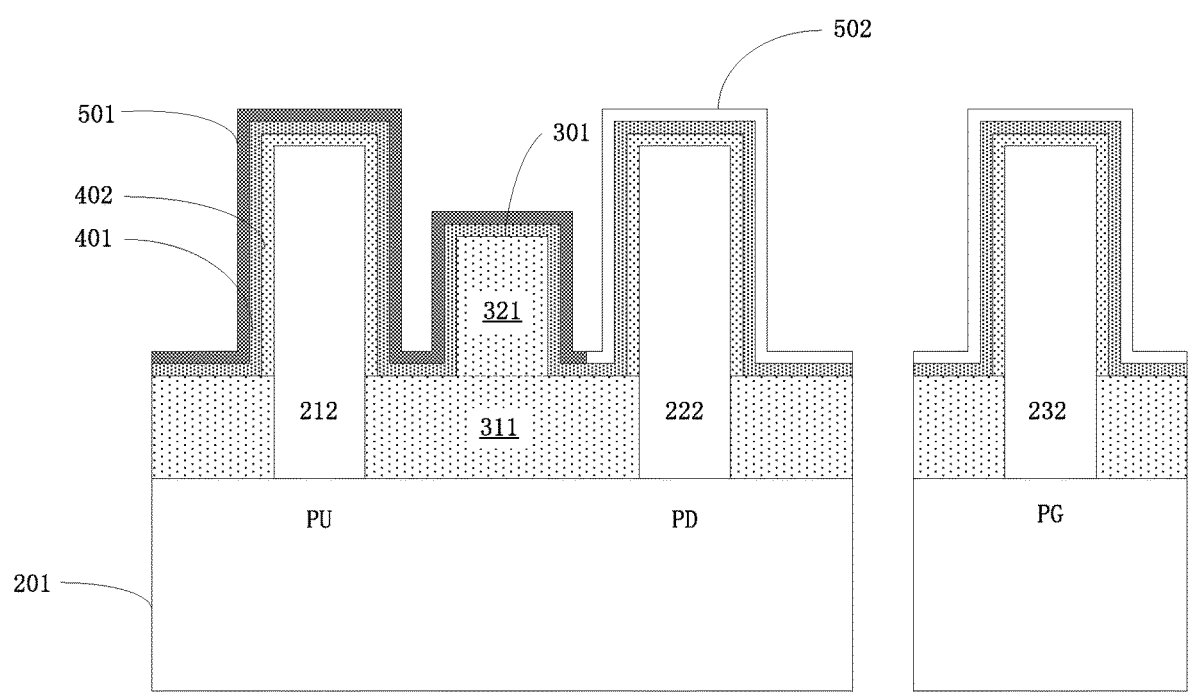

Next, referring to FIGS. 5A, 5B, and 5C, form a P-type work function regulation material layer 501 and a N-type work function regulation material layer 502. The P-type work function regulation material layer 501 is on the first semiconductor column 212 and on the gate dielectric material layer 401 on a first portion of the first separation region 301, the N-type work function regulation material layer 502 is on the second semiconductor column 222 and on the gate dielectric material layer 401 on a second portion of the first separation region 301. It should be understood that the first portion and the second portion of the first separation region 301 may or may not overlap.

In one embodiment, the P-type work function regulation material layer 501 is adjacent to the N-type work function regulation material layer 502. Referring to FIG. 5A, the P-type work function regulation material layer 501 may adjoin the N-type work function regulation material layer 502 on an upper surface of the second region 321. Referring to FIG. 5B, in another embodiment, the P-type work function regulation material layer 501 may adjoin the N-type work function regulation material layer 502 on a portion of the first region 311 between the first semiconductor column 212 and the second region 321. Referring to FIG. 5C, in yet another embodiment, the P-type work function regulation material layer 501 may adjoin the N-type work function regulation material layer 502 on a portion of the first region 311 between the second semiconductor column 222 and the second region 321.

Figure 6A:
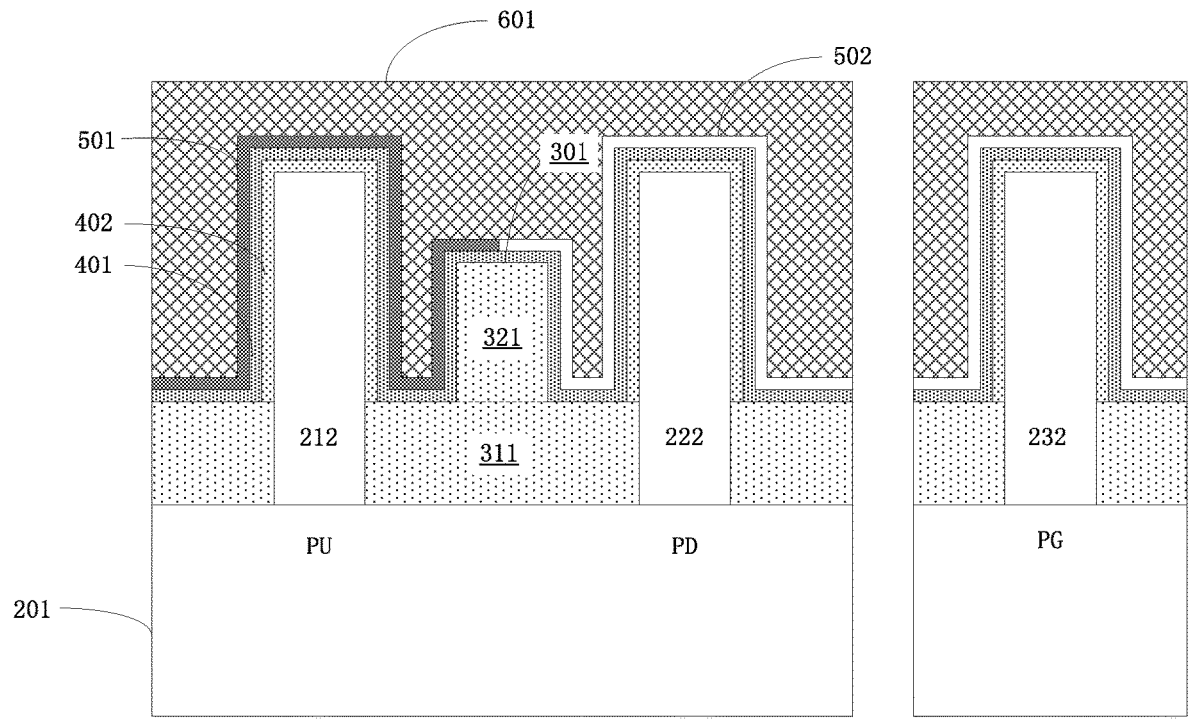
Figure 6B:
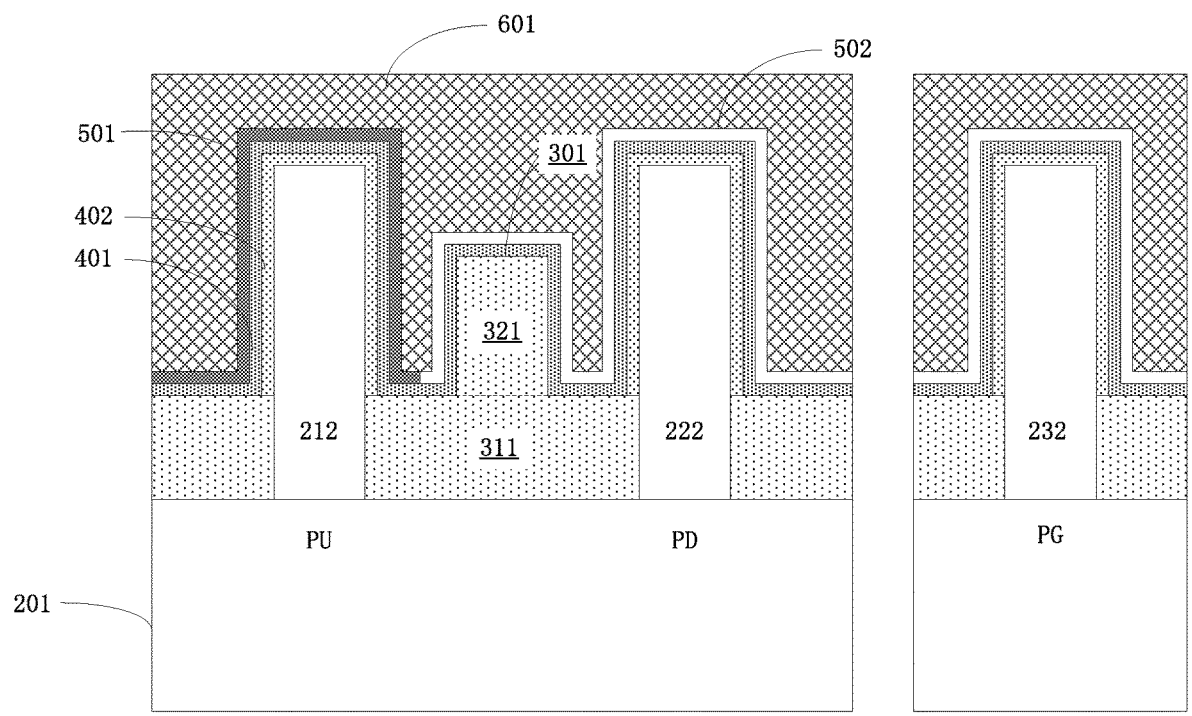
Figure 6C:
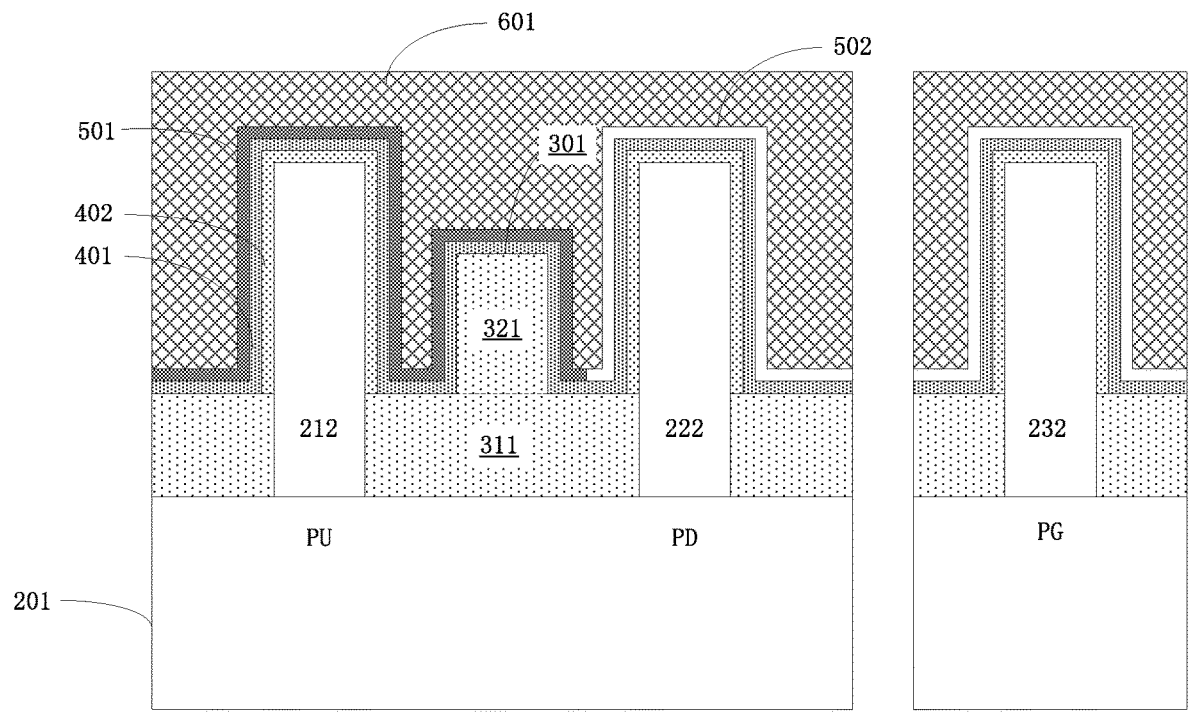

Next, referring to FIGS. 6A, 6B, and 6C, form a gate material layer 601 on the P-type work function regulation material layer 501 and the N-type work function regulation material layer 502, the gate material layer 601 may be made of a metallic material such as tungsten.

Figure 7A:
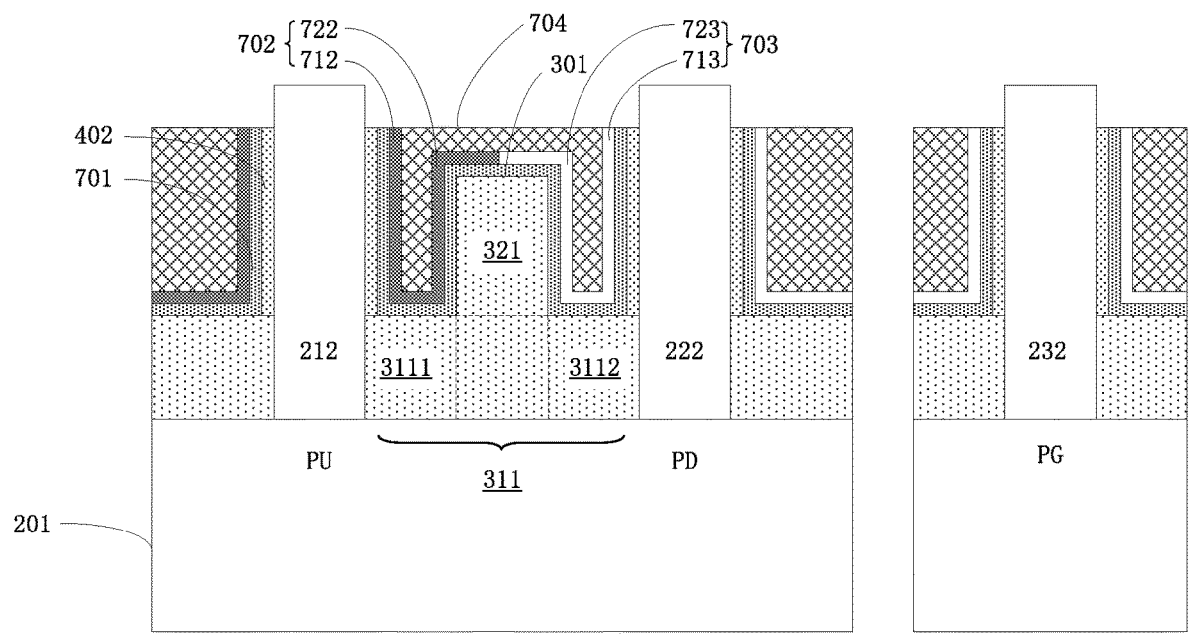
Figure 7B:
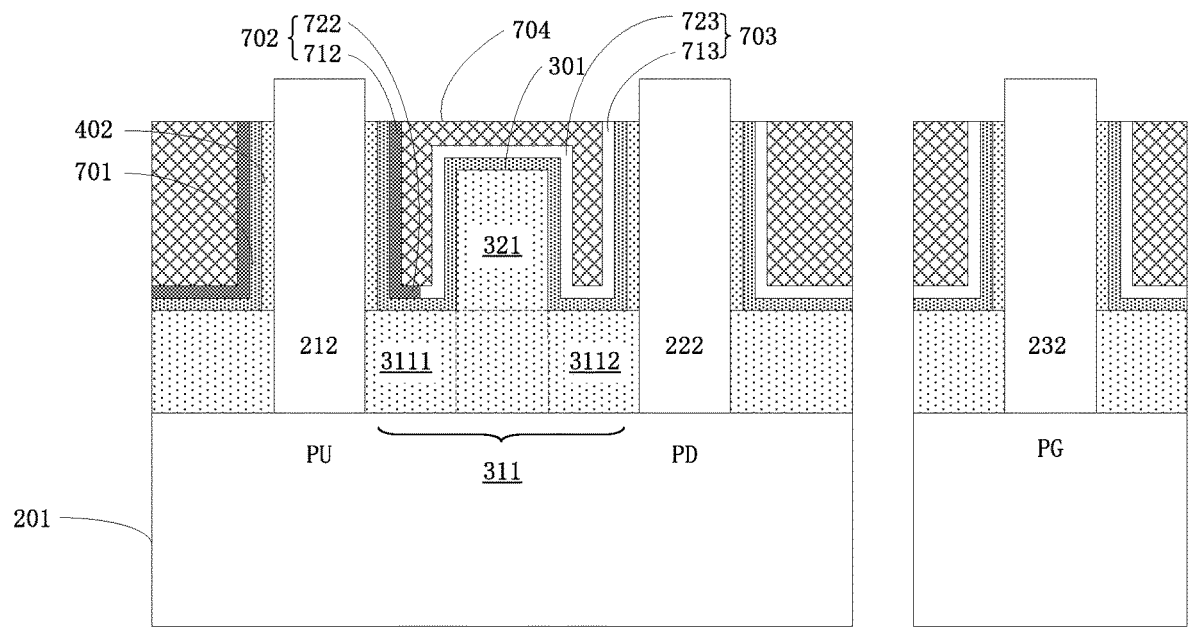
Figure 7C:
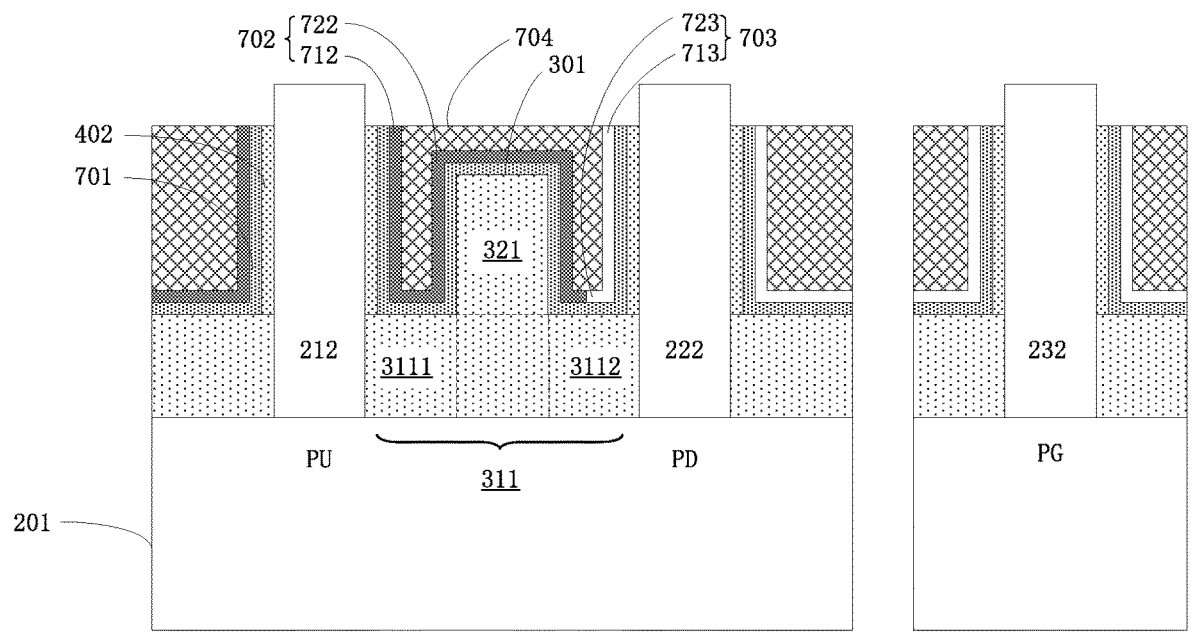

Next, referring to FIGS. 7A, 7B, and 7C, conduct an etch-back process on the gate material layer 601 to expose the gate dielectric material layer 401 and the P-type work function regulation material layer 501 on the upper portion of the first semiconductor column 212, and to expose the gate dielectric material layer 401 and the N-type work function regulation material layer 502 on an upper portion of the second semiconductor column 222. Then, remove the gate dielectric material layer 401 and the P-type work function regulation material layer 501 on the upper portion of the first semiconductor column 212, and remove the gate dielectric material layer 401 and the N-type work function regulation material layer 502 on the upper portion of the second semiconductor column 222. After that, the upper portion of the first semiconductor column 212 and the upper portion of the second semiconductor column 222 are exposed.

Here, the exact locations of the upper portion of the first semiconductor column 212 and the upper portion of the second semiconductor column 222 are not necessarily fixed. Rather, they may depend on the amount of the gate material layer 601 that is etched. And it should be understood that an upper surface of the remaining gate material layer 601 is higher than an upper surface of the second region 321.

After the etch-back process on the gate material layer 601, the remaining gate dielectric material layer 401 becomes the gate dielectric layer 701, the remaining P-type work function regulation material layer 501 becomes the P-type work function regulation layer 702, the remaining N-type work function regulation material layer 502 becomes the N-type work function regulation layer 703, and the remaining gate material layer 601 becomes the gate 704. Thus, a gate stack structure comprising the gate dielectric layer 701, the P-type work function regulation layer 702, the N-type work function regulation layer 703, and the gate 704, is formed.

Detailed structures of each major component in the gate stack structure are described below.

The gate dielectric layer 701 comprises at least a first part and a second part, with the first part on a portion of a side surface of the first semiconductor column 212, and the second part on a portion of a side surface of the second semiconductor column 222. The gate dielectric layer 701 does not cover the upper portion of the first semiconductor column 212 and the upper portion of the second semiconductor column 222, thus those portions are exposed. Optionally, the gate dielectric layer 701 may further comprise a third part on the first separation region 301 adjacent to both the first part and the second part. For example, the gate dielectric layer 701 may be made of a high-K dielectric material such as aluminium oxide ($Al_2O_3$) or hafnium dioxide ($HfO_2$).

The P-type work function regulation layer 702 may comprise a first area 712 and a second area 722 adjacent to each other. The first area 712 is on the first part of the gate dielectric layer 701, that is, on the gate dielectric layer 701 on the side surface of the first semiconductor column 212. The second area 722 is on a first portion of the first separation region 301. Part of the first area 712 and/or the second area 722 cover the base of the hole. In one embodiment, the P-type work function regulation layer 702 may be made of TiN.

The N-type work function regulation layer 703 may comprise a third area 713 and a fourth area 723 adjacent to each other. The third area 713 is on the second part of the gate dielectric layer 701, that is, on the gate dielectric layer 701 on the side surface of the second semiconductor column 222. The fourth area 723 is on a second portion of the first separation region 301. Part of the third area 713 and/or fourth area 723 cover the base of the hole. In one embodiment, the N-type work function regulation layer 703 may be made of TiAl.

The gate 704 is on both the P-type work function regulation layer 702 and the N-type work function regulation layer 703, and works as a common gate for the PU transistors and the PD transistors.

It should be understood that, when the gate dielectric layer 701 comprises the third part, the second area 722 and the fourth area 723 are on the third part of the gate dielectric layer 701. Additionally, the N-type work function regulation layer 703 may further comprise a fifth area (not shown in the drawing) on the P-type work function regulation layer 702.

In one embodiment, the second area 722 may be adjacent to the fourth area 723. The second area 722 may adjoin the fourth area 723 in several different ways, which are described below with references to FIGS. 7A, 7B, and 7C.

In the description below, as shown in FIG. 7A, a portion of the first region 311 between the first semiconductor column 212 and the second region 321 is designated as a first sub-region 3111, and a portion of the first region 311 between the second semiconductor column 222 and the second region 321 is designated as a second sub-region 3112.

Referring to FIG. 7A, in one embodiment, the second area 722 may adjoin the fourth area 723 on the second region 321. The adjoining position may be anywhere on the second region 321. For example, the adjoining position may be closer to the first semiconductor column 212 than the second semiconductor column, or closer to the second semiconductor column 222 than the first semiconductor column 212, or equidistant to both the first semiconductor column 212 and the second semiconductor column 222. This embodiment is suitable for the cases where the amount of metal diffusion from the P-type work function regulation layer 702 to the N-type work function regulation layer 703 is substantially the same as that from the N-type work function regulation layer 703 to the P-type work function regulation layer 702. Under this circumstance, the second area 722 is on the first sub-region 3111, on a side surface of the second region 321 facing the first sub-region 3111, and on a portion of the upper surface of the second region 321. The fourth region 723 is on the second sub-region 3112, on a side surface of the second region 321 facing the second sub-region 3112, and on a portion of the upper surface of the second region 321.

Referring to FIG. 7B, in another embodiment, the second area 722 may adjoin the fourth area 723 on the first sub-region 3111. This embodiment is suitable for the cases where the amount of metal diffusion from the P-type work function regulation layer 702 to the N-type work function regulation layer 703 is greater than that from the N-type work function regulation layer 703 to the P-type work function regulation layer 702. Under this circumstance, the second area 722 is on at least a portion of the first sub-region 3111. If the second area 722 is on only a portion (but not all) of the first sub-region 3111, the fourth area 723 is on an upper surface of the second sub-region 3112, on the upper surface and side surfaces of the second region 321, and on an upper surface of a portion of the first sub-region 3111. If the second area 722 is on the entire first sub-region 3111, the fourth area 723 is on the upper surface and the side surfaces of the second region 321, and on the upper surface of the second sub-region 3112.

Referring to FIG. 7C, in yet another embodiment, the second area 722 may adjoin the fourth area 723 on the second sub-region 3112. This embodiment is suitable for the cases where the amount of metal diffusion from the N-type work function regulation layer 703 to the P-type work function regulation layer 702 is greater than that from the P-type work function regulation layer 702 to the N-type work function regulation layer 703. Under this circumstance, the fourth area 723 is on at least a portion of the second sub-region 3112. If the fourth area 723 is on only a portion (but not all) of the second sub-region 3112, the second area 722 is on an upper surface and side surfaces of the second region 321, on an upper surface of the first sub-region 3111, and on an upper surface of a portion of the second sub-region 3112. If the fourth area 723 is on the entire second sub-region 3112, the second area 722 is on the upper surface and the side surfaces of the second region 321, and on the upper surface of the first sub-region 3111.

This concludes the description of a SRAM device manufacturing method in accordance with one or more embodiments of this inventive concept. In this manufacturing method, a raised second region is formed on the first region and impedes the metal diffusion from the P-type work function regulation layer to the third area in the N-type work function regulation layer, or from the N-type work function regulation layer to the first area in the P-type work function regulation layer. Thus, it helps to mitigate the mismatch issue among the PU transistors and the PD transistors.

After the gate stack structure is formed, the succeeding manufacturing processes may be conducted according to actual production requirement. Some example manufacturing processes after the gate stack structure is formed are described below with reference to FIGS. 8 and 9.

Figure 8:
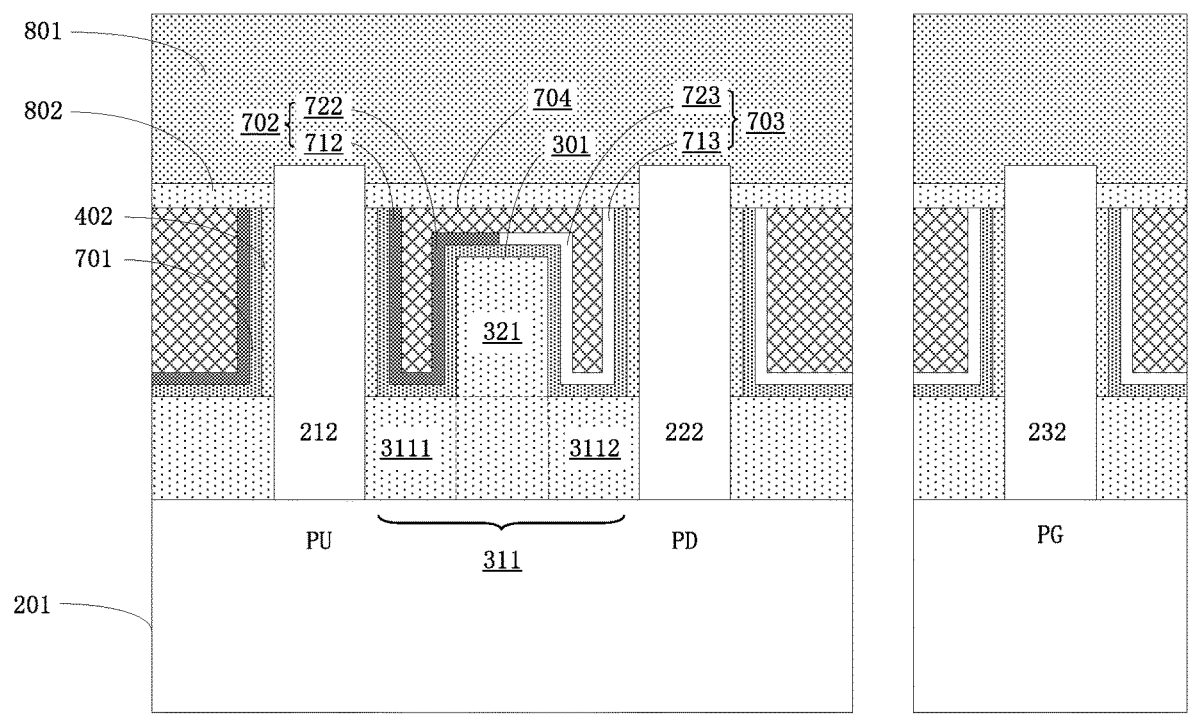
FIGS. 8 and 9 show cross-sectional views illustrating different stages of a SRAM device manufacturing method in accordance with another embodiment of this inventive concept.

Referring to FIG. 8, an inter-layer dielectric layer 801 (e.g., a silicon oxide layer) may be formed on the gate stack structure covering the upper portion of the first semiconductor column 212 and the upper portion of the second semiconductor column 222. Before the inter-layer dielectric layer 801 is formed, a second separation region 802 (e.g., a silicon oxide layer) may be formed on the gate stack structure, with an upper surface of the second separation region 802 lower than upper surfaces of the first semiconductor column 212 and the second semiconductor column 222.

Figure 9:
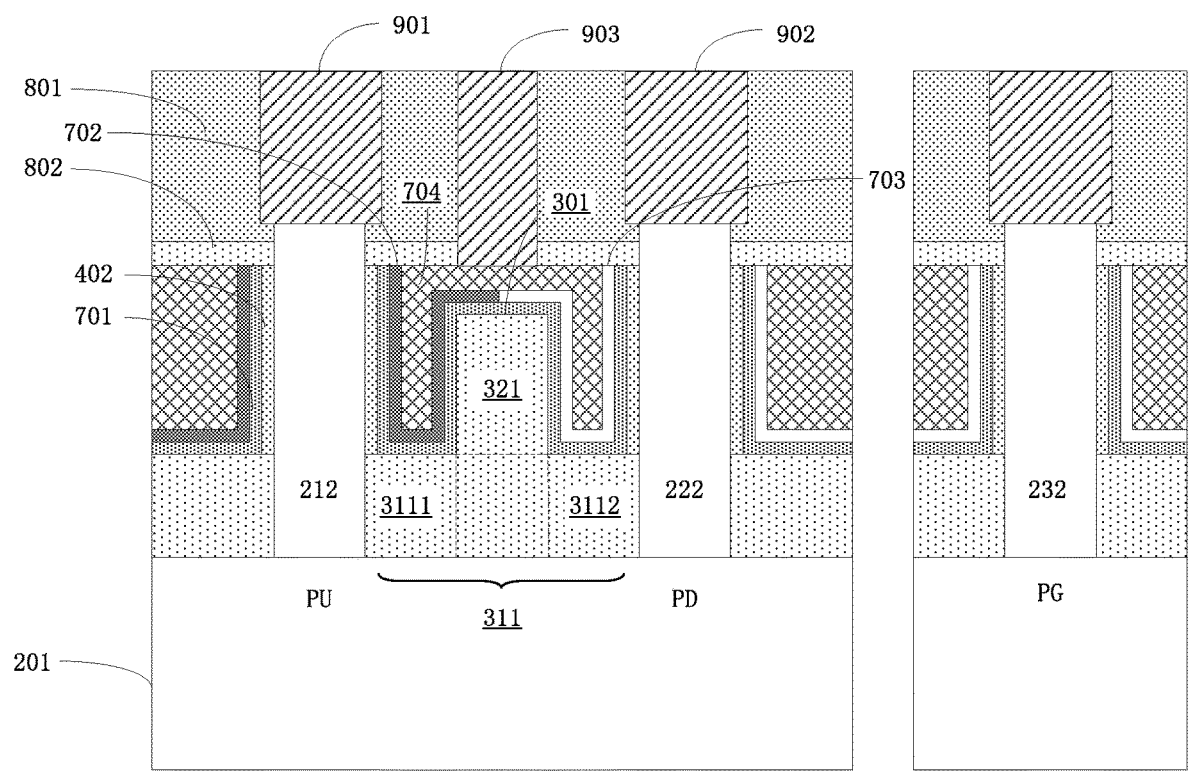

Referring to FIG. 9, a first contact component 901, a second contact component 902, a third contact component 903, and a fourth contact component 904 (not shown in the drawings) may be formed, with the first contact component 901 extending from an upper surface of the inter-layer dielectric layer 801 to the upper surface of the first semiconductor column 212, the second contact component 902 extending from the upper surface of the inter-layer dielectric layer 801 to the upper surface of the second semiconductor column 222, the third contact component 903 extending from the upper surface of the inter-layer dielectric layer 801 to the gate 704, and the fourth contact component 904 extending from the upper surface of the inter-layer dielectric layer 801 to the substrate 201.

The manufacturing method described above may also be used to form a gate stack structure and contact components for the PG transistors.

This inventive concept further presents a SRAM device, which may be manufactured by the manufacturing method described above or by other manufacturing methods.

Referring to FIGS. 7A, 7B, and 7C, in one embodiment, the SRAM device may comprise a substrate 201, a first semiconductor column 212 for PU transistors, and a second semiconductor column 222 for PD transistors, with the first semiconductor column 212 and the second semiconductor column 222 on the substrate 201. In one embodiment, the first semiconductor column 212 and the second semiconductor column 222 may both comprise nanowires.

The SRAM device may further comprise a first separation region 301 on the substrate 201 between the first semiconductor column 212 and the second semiconductor column 222. The first separation region 301 may comprise a first region 311 and a second region 321, with the first region 311 adjacent to both the first semiconductor column 212 and the second semiconductor column 222, and the second region 321 on the first region 311 and separated from the first semiconductor column 212 and the second semiconductor column 222.

The SRAM device may further comprise a gate stack structure, comprising a gate dielectric layer 701, a P-type work function regulation layer 702, an N-type work function regulation layer 703, and a gate 704. Detailed structures of each major component in the gate stack structure are the same as those described above and therefore are not repeated here for conciseness purpose.

Referring to FIG. 9, in one embodiment, the SRAM device may further comprise an inter-layer dielectric layer 801 on the gate stack structure covering upper portions of the first semiconductor column 212 and the second semiconductor column 222. The SRAM device may further comprise a second separation region 802 between the gate stack structure and the inter-layer dielectric layer 801, with an upper surface of the second separation layer 802 lower than upper surfaces of the first semiconductor column 212 and the second semiconductor column 222.

Referring to FIG. 9, in one embodiment, the SRAM device may further comprise a first contact component 901, a second contact component 902, a third contact component 903, and a fourth contact component 904 (not shown in the drawings), with the first contact component 901 extending from an upper surface of the inter-layer dielectric layer 801 to an upper surface of the first semiconductor column 212, the second contact component 902 extending from the upper surface of the inter-layer dielectric layer 801 to an upper surface of the second semiconductor column 222, the third contact component 903 extending from the upper surface of the inter-layer dielectric layer 801 to the gate 704, and the fourth contact component 904 extending from the upper surface of the inter-layer dielectric layer 801 to the substrate 201.

This concludes the description of a SRAM device and its manufacturing method in accordance with one or more embodiments of this inventive concept. For purposes of conciseness and convenience, some components or procedures that are well known to one of ordinary skills in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A Static Random-Access Memory (SRAM) device, comprising:
   a substrate;
   a first semiconductor column for Pull-Up (PU) transistors and a second semiconductor column for Pull-Down (PD) transistors, with both the first and the second semiconductor columns on the substrate;
   a first separation region on a face of the substrate and between the first and the second semiconductor columns in a direction parallel to the face of the substrate, comprising:
      a first region adjacent to both the first and the second semiconductor columns; and
      a second region on the first region and separated from the first and the second semiconductor columns; and
   a gate stack structure exposing an upper portion of the first semiconductor column and an upper portion of the second semiconductor column, comprising:
      a gate dielectric layer comprising a first part and a second part, with the first part on a portion of a side surface of the first semiconductor column and the second part on a portion of a side surface of the second semiconductor column;
      a P-type work function regulation layer comprising a first area and a second area adjacent to each other, with the first area on the first part of the gate dielectric layer, and the second area on a first portion of the first separation region;
      a N-type work function regulation layer comprising a third area and a fourth area adjacent to each other, with the third area on the second part of the gate dielectric layer, and the fourth area on a second portion of the first separation region; and
      a gate on both the P-type and N-type work function regulation layers,
   wherein a first section of the gate overlaps the first region and is positioned between the first semiconductor column and the second region in the direction,
   wherein a second section of the gate overlaps the first region and is positioned between the second semiconductor column and the second region in the direction, and
   wherein a third section of the gate overlaps the second region, is positioned between the first semiconductor column and the second semiconductor column in the direction, and is directly connected to each of the first section of the gate and the second section of the gate.

2. The SRAM device of claim 1, wherein the second area and the fourth area are adjacent to each other.

3. The SRAM device of claim 2, wherein the first region comprises a first sub-region and a second sub-region, with the first sub-region located between the first semiconductor column and the second region, and the second sub-region located between the second semiconductor column and the second region,
   and wherein the second area adjoins the fourth area on an upper surface of the second region, on an upper surface of the first sub-region or on an upper surface of the second sub-region.

4. The SRAM device of claim 1, wherein the gate dielectric layer further comprises a third part on the first separation region adjacent to both the first part and the second part, with both the second area and the fourth area on the third part of the gate dielectric layer.

5. The SRAM device of claim 1, wherein the N-type work function regulation layer further comprises a fifth area on the P-type work function regulation layer.

6. The SRAM device of claim 1, wherein the first semiconductor column and the second semiconductor column comprise nanowires.

7. The SRAM device of claim 1, wherein the gate dielectric layer comprises a high-K dielectric material.

8. A Static Random-Access Memory (SRAM) device, comprising:
   a substrate;
   a first semiconductor column for Pull-Up (PU) transistors and a second semiconductor column for Pull-Down (PD) transistors, with both the first and the second semiconductor columns on the substrate;
   a first separation region on the substrate between the first and the second semiconductor columns, comprising:
      a first region adjacent to both the first and the second semiconductor columns; and
      a second region on the first region and separated from the first and the second semiconductor columns; and
   a gate stack structure exposing an upper portion of the first semiconductor column and an upper portion of the second semiconductor column, comprising:
      a gate dielectric layer comprising a first part and a second part, with the first part on a portion of a side surface of the first semiconductor column and the second part on a portion of a side surface of the second semiconductor column;
      a P-type work function regulation layer comprising a first area and a second area adjacent to each other, with the first area on the first part of the gate dielectric layer, and the second area on a first portion of the first separation region;

a N-type work function regulation layer comprising a third area and a fourth area adjacent to each other, with the third area on the second part of the gate dielectric layer, and the fourth area on a second portion of the first separation region; and a gate on both the P-type and N-type work function regulation layers;

an inter-layer dielectric layer on the gate stack structure covering an upper portion of the first semiconductor column and an upper portion of the second semiconductor column;

a first contact component extending from an upper surface of the inter-layer dielectric layer to the upper surface of the first semiconductor column;

a second contact component extending from the upper surface of the inter-layer dielectric layer to the upper surface of the second semiconductor column;

a third contact component extending from the upper surface of the inter-layer dielectric layer to the gate; and a fourth contact component extending from the upper surface of the inter-layer dielectric layer to the substrate.

9. The SRAM device of claim 8, further comprising:

a second separation region between the gate stack structure and the inter-layer dielectric layer, with an upper surface of the second separation region lower than the upper surfaces of the first semiconductor column and the second semiconductor column.

\* \* \* \* \*